US007154298B1

(12) United States Patent
Agrawal et al.

(10) Patent No.: US 7,154,298 B1
(45) Date of Patent: *Dec. 26, 2006

(54) BLOCK-ORIENTED ARCHITECTURE FOR A PROGRAMMABLE INTERCONNECT CIRCUIT

(75) Inventors: Om P. Agrawal, Los Altos, CA (US); Jinghui Zhu, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 994 days.

This patent is subject to a terminal disclaimer.

(21) Appl. No.: 10/022,464

(22) Filed: Dec. 14, 2001

(51) Int. Cl.
*H03K 19/177* (2006.01)

(52) U.S. Cl. .............................. 326/41; 326/40; 326/39

(58) Field of Classification Search .................. 326/38, 326/41
See application file for complete search history.

(56) References Cited

U.S. PATENT DOCUMENTS

| 5,831,448 | A | * | 11/1998 | Kean ........................... 326/41 |
| 6,034,541 | A | | 3/2000 | Kopec, Jr. et al. |
| 6,608,500 | B1 | * | 8/2003 | Lacey et al. .................. 326/39 |
| 6,864,710 | B1 | * | 3/2005 | Lacey et al. .................. 326/39 |

* cited by examiner

*Primary Examiner*—Vibol Tan
(74) *Attorney, Agent, or Firm*—MasPherson Kwok Chen & Heid LLP; Jon W. Hallman

(57) ABSTRACT

A programmable interconnect circuit comprising a plurality of I/O cells arranged into blocks includes a routing structure for each block, wherein each routing structure may programmably route signals between its block's I/O cells and the I/O cells within the remaining blocks.

23 Claims, 9 Drawing Sheets

BLOCK-ORIENTED ARCHITECTURE FOR A PROGRAMMABLE INTERCONNECT CIRCUIT

RELATED APPLICATION

This application is related to U.S. applications application Ser. No. 10/023,053, "Multi-level Routing Structure for a Programmable Interconnect Circuit," now U.S. Pat. No. 6,653,861 and U.S. application Ser. No. 10/021,844, "I/O Block for a Programmable Interconnect Circuit," now U.S. Pat. No. 6,703,860, both concurrently filed herewith, the contents of both of which are hereby incorporated by reference in their entirety.

BACKGROUND

1. Field of the Invention

This invention relates to programmable interconnect circuits, and more particularly to a programmable interconnect circuit having an architecture suitable for bus switching applications.

2. Description of Related Art

In-system-programmable interconnect devices permit a user to programmably route signals between pins of the device. For example, Lattice Semiconductor Corp. currently manufactures an ispGDX® family of programmable interconnect devices having a non-volatile $E^2CMOS$® in-system-programmable crossbar switch matrix for programmable switching, interconnect, and jumper functions. Each pin of the ispGDX® device is associated with an input/output (I/O) circuit that programmably couples to other I/O circuits through a routing structure denoted as a global routing pool (GRP). The I/O circuits contain registers allowing the input and output signals on the associated pins to be selectively registered.

Referring now to FIG. 1, an input/output circuit 10 for an ispGDX.® device couples to a 4:1 multiplexer (Mux) 12 that receives signals A, B, C, and D from four different routing structures, GRP_A, GRP_B, GRP_C, and GRP_D, (not illustrated) respectively. Each routing structure corresponds to a given quadrant (a side of the integrated circuit) for the device. Accordingly, GRP_A receives the input signals from I/O pins 20 in quadrant A, GRP_B receives the input signals from I/O pins 20 in quadrant B, and so on. Input/output (I/O) circuit 10 receives its input signals from its pin 20 and directs them to the appropriate global routing structure on path 19. For example, if I/O circuit 10 is within quadrant A, path 19 would couple to GRP_A.

Each routing structure is a switch matrix that may receive input signals from selected I/O circuits and programmably route output signals to selected I/O circuits. For clarity, the individual structures are grouped together and jointly designated by a single routing structure 14. A similar device or circuit is disclosed in U.S. Pat. No. 6,034,541, the contents of which are hereby incorporated by reference in their entirety. In addition, each global routing pool has a switch matrix fused by an in-system-programmable non-volatile $E^2CMOS$® memory bank, configured for one-way routability. A given memory cell in the volatile $E^2CMOS$® memory bank controls the state of a "fuse point" in the switch matrix. The fuse point may be formed by, e.g., a pass transistor that will programmably connect an input lead of the switch matrix to an output lead of the switch matrix, depending upon the logical state (high or low) of the fuse point's memory cell. I/O pins 20 to the device are arranged in quadrants (the four sides to the chip) such that an individual routing structure receives signals from the I/O circuits 10 in a single quadrant and may distribute these signals to the I/O cells circuits 10 in all four quadrants. Thus, the four input signals A, B, C, and D for each Mux 12 are "quadrant" limited to originate in their respective quadrants. Note that, with respect to routing structure 14, each I/O circuit 10 is independent and separate from the remaining I/O circuits. Because routing structure 14 distributes signals independently to each I/O circuit 10, the resulting arrangement may be denoted as "pin-oriented" or "bit-oriented" in that each I/O circuit 10 associates with a single I/O pin 20.

Similar to the data signals, control signals, such as the set/reset, clock, and clock enable (CE) for an input/output register (not illustrated) located within I/O circuit 10, the output enable (OE) for an output buffer (not illustrated) located within I/O circuit 10, as well as the MUX selects for MUX 12, are also limited to originating in a subset of pins 20 from each quadrant. Moreover, the prior art device had no control logic capability for these control signals such that the control function for each signal was limited to a single pin.

Although this "bit-oriented" architecture allowed a user to programmably interconnect signals through the device, the number of fuses in the resulting global routing pool becomes prohibitive as the pin count increases. However, modern board density continues to increase, demanding an interconnect device having a suitable number of pins to interconnect the signals.

Accordingly, there is a need in the art for an improved programmable interconnect device that uses fewer fuses and provides greater flexibility in the mapping of data and control signals.

SUMMARY

In accordance with one aspect of the invention, a programmable interconnect circuit includes a plurality of I/O circuits arranged into I/O blocks. Each I/O block has its own routing structure programmably coupling I/O signals between the I/O block's I/O circuits and the I/O circuits in the remaining I/O blocks. In this fashion, an I/O circuit in a given I/O block may programmably receive I/O signals from or transmit I/O signals to the I/O circuits in all the blocks. The routing structure programmably routes the I/O signals according to configuration data stored in a memory device that may be in-system programmable.

In accordance with another aspect of the invention, a programmable interconnect circuit includes a plurality of I/O blocks, each I/O block having at least two I/O cells. Each I/O cell includes a multiplexer coupled to an I/O circuit, where each multiplexer within an I/O block shares a common set of control signal paths coupled to its select terminals. However, each multiplexer has different sets of data signal paths coupled to its input terminals. A routing structure receives input signals and routes them to each I/O block, where the routing structure is programmable to provide control signals for the common set of control signal paths and data signals for the different sets of data signal paths.

The invention will be more fully understood upon consideration of the detailed description below, taken together with the accompanying drawings.

BRIEF DESCRIPTION OF THE DRAWINGS

Use of the same reference symbols in different figures indicates similar or identical items.

DETAILED DESCRIPTION OF THE PREFERRED EMBODIMENTS

Figure 2:
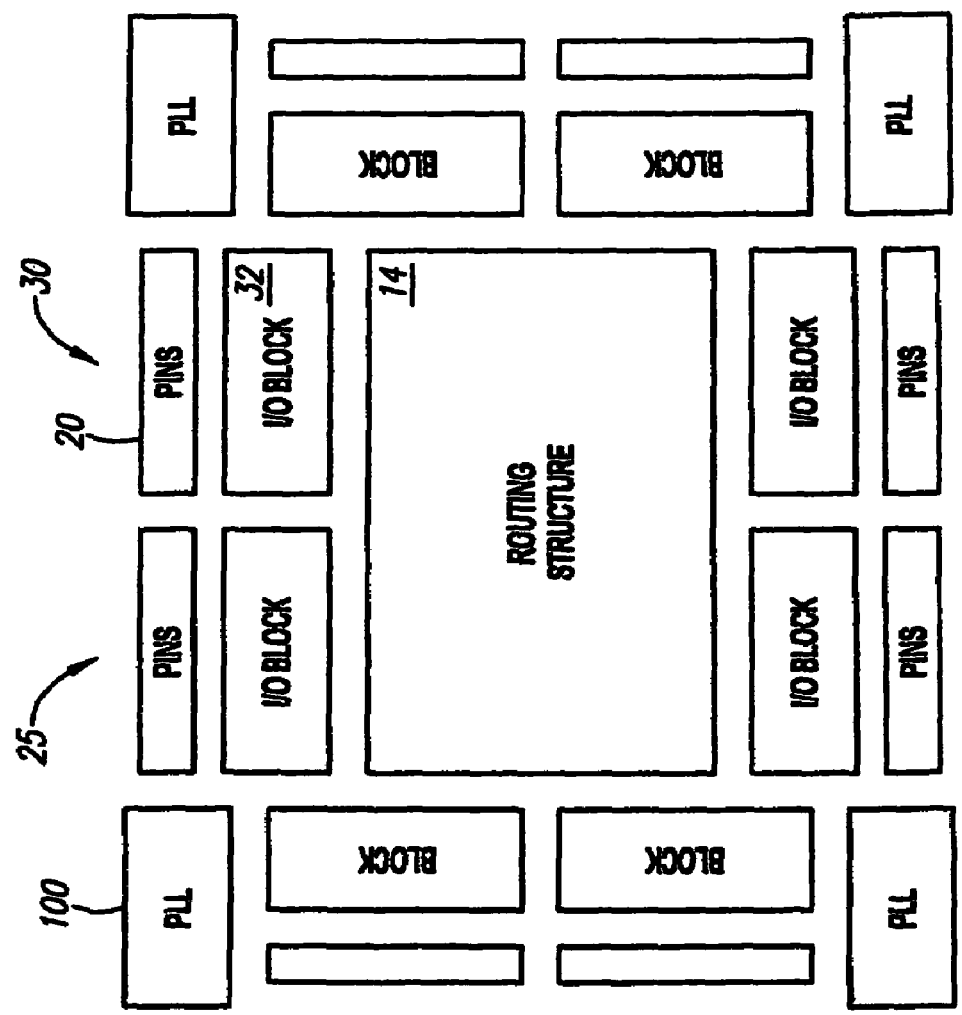
FIG. 2 illustrates a block-oriented architecture for a programmable interconnect circuit according to one embodiment of the invention.
Figure 3:
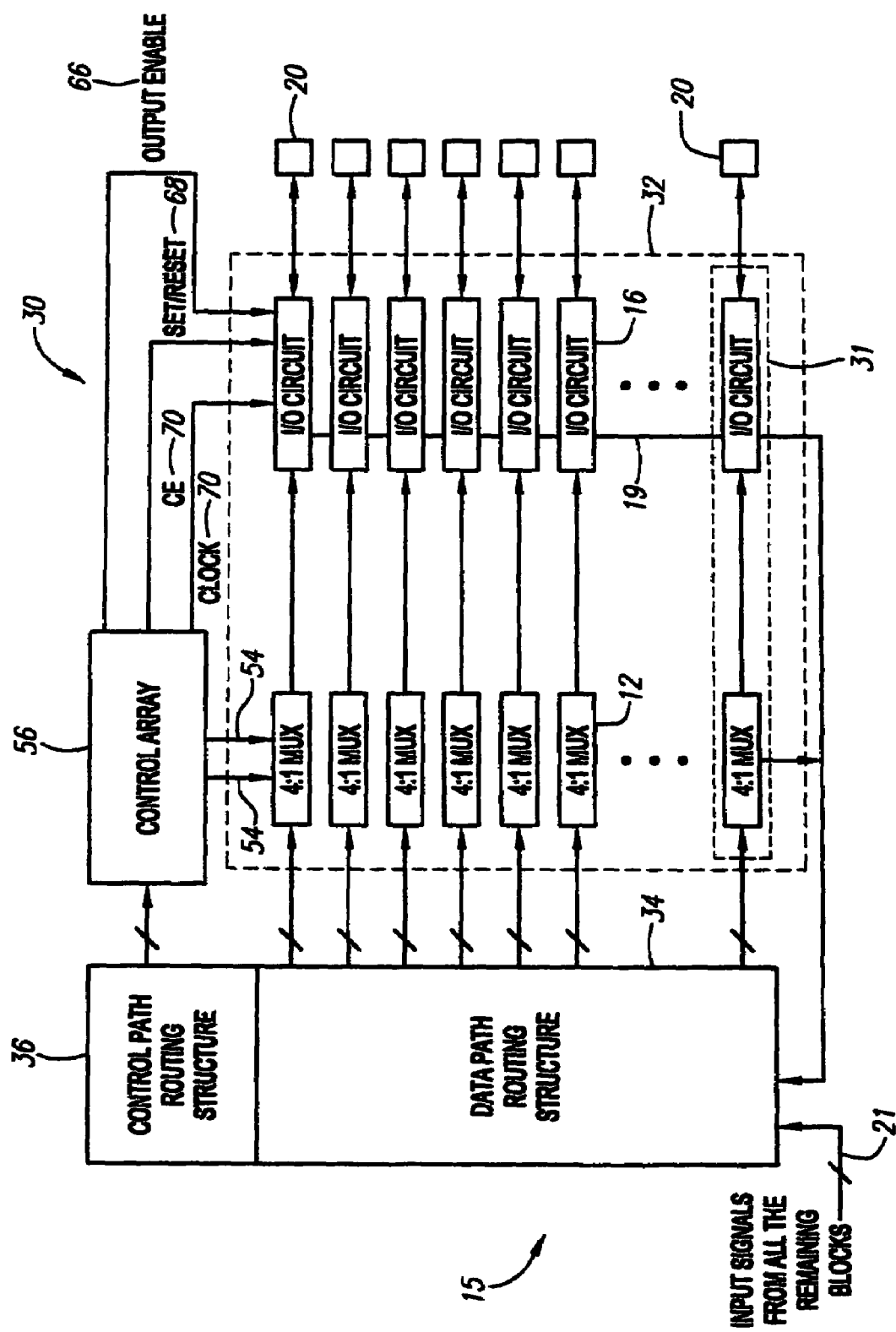
FIG. 3 illustrates further aspects of block-oriented architecture for the programmable interconnect circuit of FIG. 2 according to one embodiment of the invention.

Referring now to FIGS. 2 and 3, a "block-oriented" programmable interconnect architecture 30 is illustrated. In contrast to the "bit-oriented" architecture of the prior art, the I/O circuits 16 (FIG. 3) are arranged in I/O blocks 32 such that each block 32 having a plurality X of I/O circuits 16 associates with its own routing structure 15 (FIG. 3). In general, X is arbitrary as any number of I/O circuits 16 may be assigned to an I/O block 32. However, because bus-switching applications typically route binary signals in groups of 8 (one byte) or 16 (two bytes), assigning 16 I/O circuits per I/O block 32 as illustrated in FIG. 3 is particularly convenient. It will be appreciated, however, that other numbers of I/O circuits per I/O block may be used, for example, 4 or 8. Each I/O circuit 16 may be contained within an I/O cell 31, which also includes a 4:1 Mux 12 for selecting data signal inputs for its I/O circuit 16 (for clarity, only one I/O cell 31 is illustrated in FIG. 3). In FIG. 2, the routing structures 15 are collectively denoted as a single routing structure 14. Referring again to FIG. 3, each I/O circuit 16 may receive input signals from its pin 20. These input signals may comprise data signals that will ultimately be routed to other pins 20. Alternatively, these input signals may comprise control signals for controlling, for example, multiplexers 12 or registers within I/O circuits 16.

As will be described further herein, interconnect device 25 is programmable because of its association with a programmable memory (not illustrated), which is typically non-volatile but may be implemented as a volatile memory if desired. A user would program memory elements within the programmable memory to desired logic levels. These memory elements then control programmable elements such as fuse points, multiplexers, and switches within interconnect device 25 so as to effect a desired mode of operation. The programmable memory is preferably in system programmable, such that a user may change the programming during operation of the interconnect device.

Each I/O block 32 may receive signals from two independent routing programmably coupling control signals to a control array 56, which in turn provides product-term control signals to block 32. It will be appreciated that although data-path routing structure 34 and the control-path routing structure 36 are independent, such independence may be conceptual only in that the data-path routing structure 34 and control-path routing structure 36 may be combined into a single global routing structure. For example, a single switch matrix may accommodate both data and control signals. However, the fuse patterns within the switch matrix or global routing structure may differ according to whether data signals or control signals are being routed.

As will be explained further herein, the control array 56 within I/O block 32 produces a set of product-term control signals. One set of product-term signals provides the MUX select signals 54 for the 4:1 MUXes 12. Each I/O circuit 16 may include an input register 90, an output register 92, and an output enable register 94 discussed with respect to FIG. 7. Other sets of product-term signals from the control array 56 provide the clock and clock enable (CE) signals 70, the set/reset signals 68 and the OE signals 66 for these registers.

Figure 4:
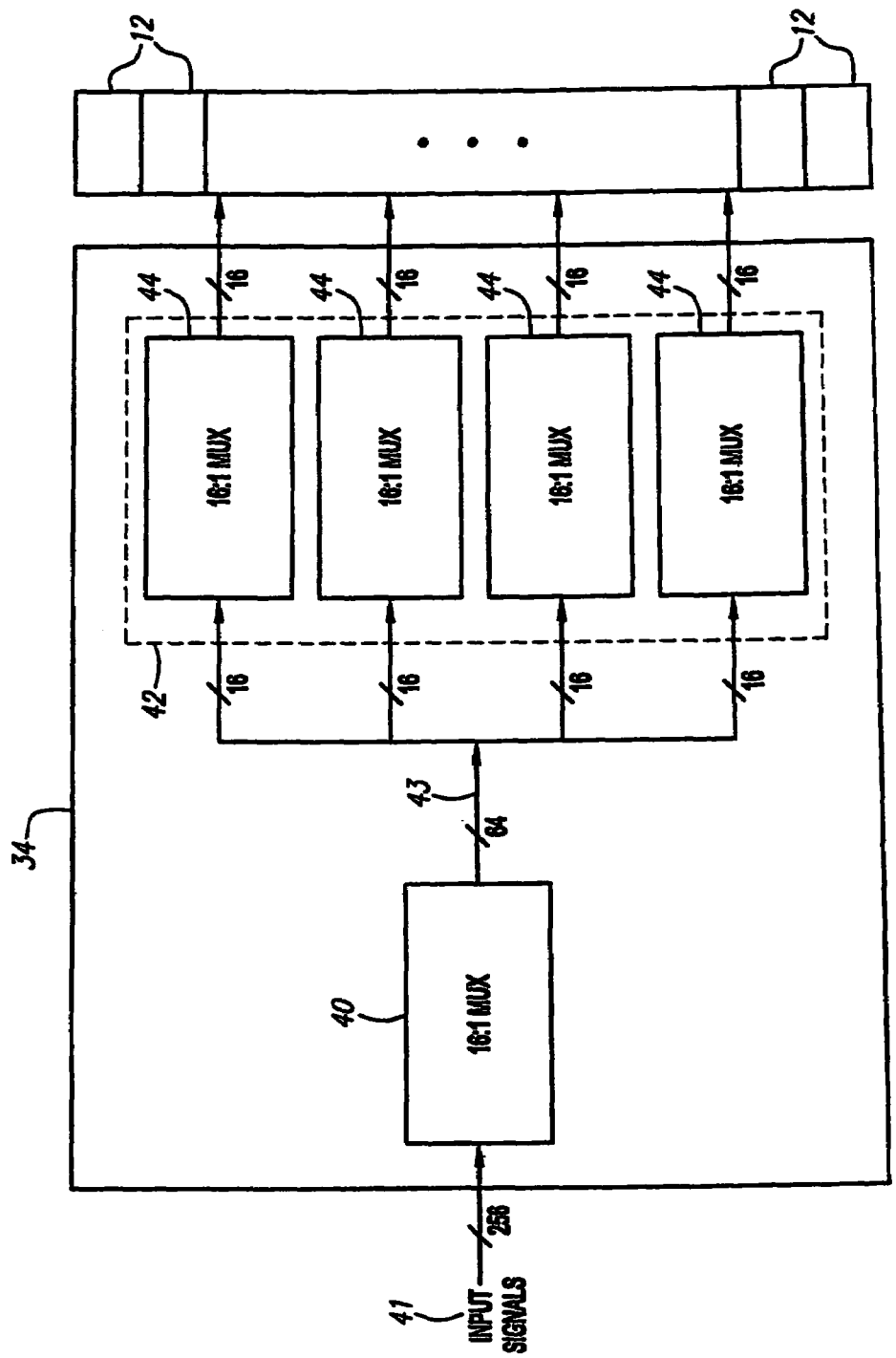
FIG. 4 illustrates a two level data-path routing structure according to one embodiment of the invention.

Arranging the I/O circuits 16 into I/O blocks 32 allows each data-path routing structure 34 and control-path routing structure 36 to be arranged in a two-level organization. The following discussion will summarize this two level organization, which is described more fully in the co-pending application entitled "Multi-level Routing Structure for a Programmable Interconnect Circuit," concurrently filed herewith. As shown in FIG. 4, data-path routing structure 34 may comprise a first level data-path routing structure 40 and a second level data-path routing structure 42. First level data-path routing structure 40 receives input signals 41 that may originate from pins 20 corresponding to all I/O blocks 32 of the device. Each pin 20 associates with an I/O circuit 16. Thus, if there are 256 I/O circuits 16, first level data-path routing structure 40 may receive 256 input signals 41. To reduce the fuse count, first level data-path routing structure's switch matrix (not illustrated), which may be fused by a non-volatile memory bank (not illustrated), is only partially populated, thereby forming an M:1 MUX for each output signal carried on bus 43, where M corresponds to the ratio of the total number of input signals 41 feeding first level data-path routing structure 40 to the number of I/O circuits 16 within the first level data-path routing structure's I/O block 32. Accordingly, given that I/O blocks 32 each have a fixed number X of I/O cells, the total number of input signals 41 feeding first level data-path routing structure 40 becomes (N*X), where N is the total number of I/O blocks 32. M then equals (N*X)/X, which equals N, the total number of I/O blocks. Thus, the M:1 MUX formed for each output on bus 43 of first level data-path routing structure 40 depends upon the number of I/O blocks 32 within the device. If there are sixteen I/O blocks 32, the fuse pattern within first level data-path routing structure 40 may be such that it forms a 16:1 MUX for each output signal carried on bus 43. Similarly, because the 4:1 MUX 12 (FIG. 3) coupled to each I/O circuit 16 (FIG. 3) receives 4 input data signals, an I/O block 32 having sixteen I/O circuits requires 64 input data signals. In such an embodiment, first level data-path routing structure 40 will thus have a 64 bit wide output bus 43. The resulting switch matrix (not illustrated) for this embodiment of a first level data-path routing structure 40 is four-way routed in that each input signal has four different paths it may take to reach the output. In other words, an input lead to the first level data-path routing structure 40 may have four fuse points connecting it to output leads, providing the four different paths.

Figure 1:
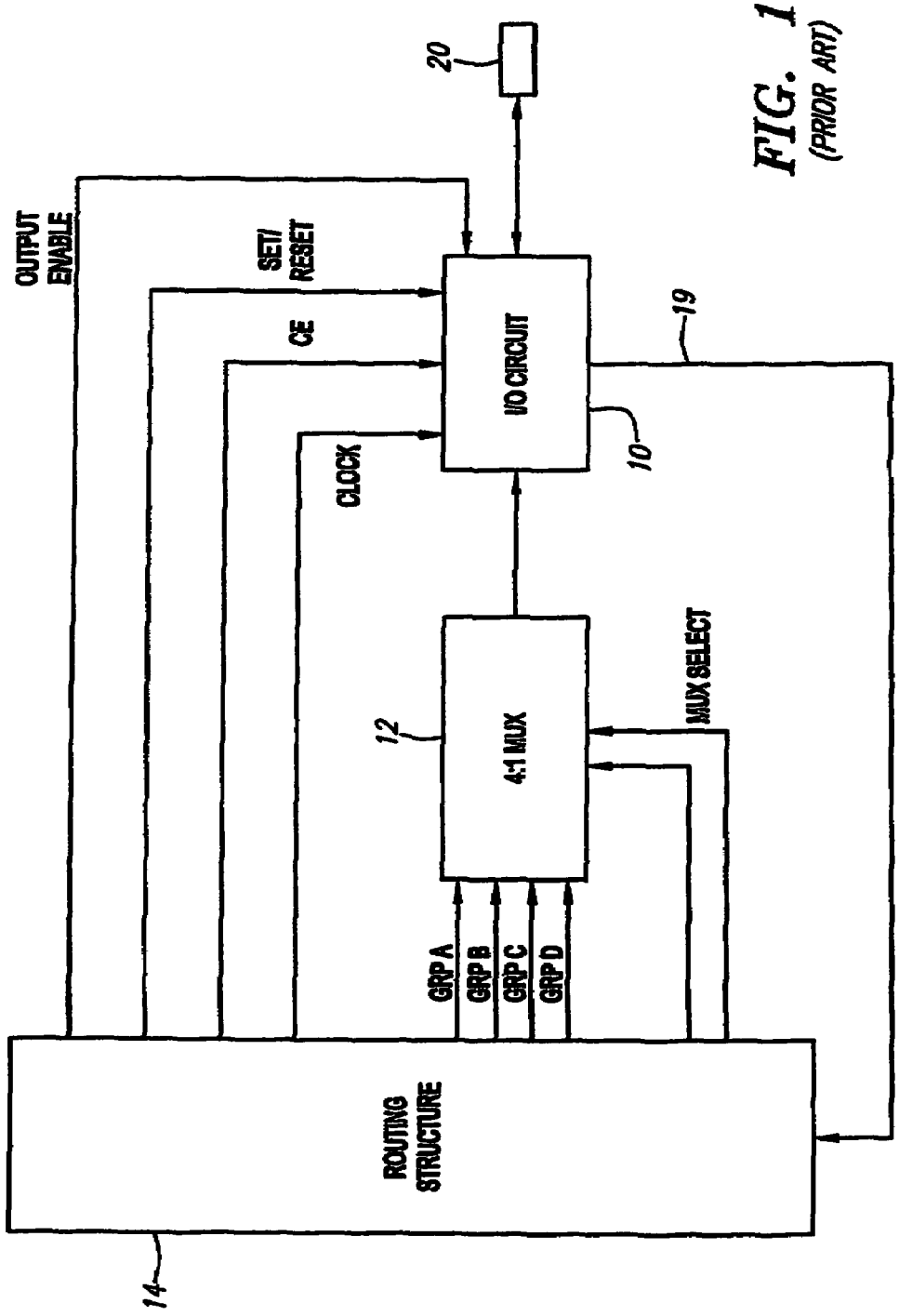
FIG. 1 illustrates a prior art programmable interconnect architecture.

To permit increased flexibility in signal routing to any given 4:1 Mux 12 within I/O block 32 associated with first level data-path routing structure 40, a second level data-path routing structure 42 couples the first level data-path routing structure 40 to the I/O block 32. The switch matrix (not illustrated) for the second level data-path routing structure 42 may be fully populated to provide this increased flexibility. This switch matrix may be fused by a non-volatile in-system-programmable memory bank. Second level data-path routing structure 42 may be conceptually organized into groups of X signals corresponding to the number X of I/O circuits 16 assigned to any given I/O block 32. For an X=16 architecture, the resulting second level data-path routing structure 42 is organized into four blocks 44, each corresponding to a consecutive group of 16 signals on bus 43 from first level data-path routing structure 40. Each block 44 provides 16 signals to drive four 4:1 MUXes 12. Thus, each block 44 receives 16 signals and programmably routes these signals into 16 output signals. Because any particular one of the received 16 signals may be routed to become any particular one of the 16 output signals, block 44 forms a 16:1 Mux for each of the 16 output signals. These 16 output signals become the input signals for four 4:1 multiplexers 12 within the I/O block 32 associated with the particular data-path routing structure 34. Note that the 16 input signals for each block 44 (provided by the first level data-path routing structure 40) are derived from any 16 of the 256 input signals. Because the block 44 in the second level data-path routing structure 42 receiving these 16 signals has a fully-populated switch matrix, the four inputs for any given 4:1 Mux 12 can come from any of the 256 input signals. This routing is advantageous over the prior art architecture discussed with respect to FIG. 1. The inputs to the 4:1 Mux 12 (FIG. 3) are no longer "quadrant" restricted, in that the four inputs to each 4:1 Mux 12 can come from one side, two sides, three sides, or all four sides of the device. In addition to removing the quadrant restriction of the prior art, the two level organization for data-path routing structure 34 provides a significant reduction in fuse count.

Figure 5:
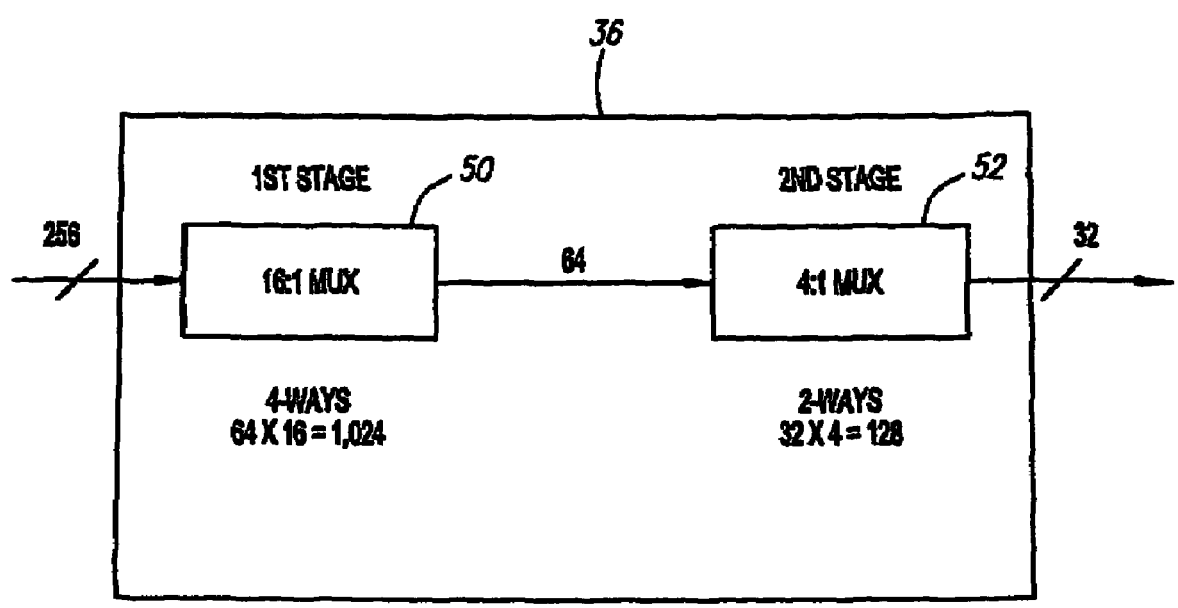
FIG. 5 illustrates a two level control-path routing structure according to one embodiment of the invention.

A similar two-level organization may be used for the control-path routing structure 36. Thus, control path routing structure 36 may comprise a first level control-path routing structure 50 and a second level control-path routing structure 52. As shown in FIG. 5, for a device having 256 I/O circuits 16, a first level control-path routing structure 50 may receive 256 input signals 53. The switch matrix (not illustrated) is fused such that each output of the first level control path routing structure 50 forms an M:1 Mux corresponding to the total number of I/O blocks 32 as discussed with respect to the first level data-path routing structure 40. In the embodiment illustrated in FIG. 5, the number of I/O blocks 32 (FIG. 3) equals 16 such that the first level control-path routing structure 50 forms a 16:1 Mux for each of its 64 output signals. Thus, the first level control-path routing structure 50 may have a similar fuse pattern to that used for the first level data-path routing structure 40.

However, unlike certain embodiments of second level data-path routing structure 42, there is no need for the second level control-path routing structure 52 to have a fully-populated switch matrix, if an assumption is made about the use of the resulting device. For example, consider the Mux select signals 54 (FIG. 3) required to control the set of 4:1 multiplexers 12 for each I/O block 32. Because each Mux 12 requires two Mux select signals 54, a fully independent Mux control structure would require 32 independent Mux select signals 54. However, in many applications such as bus switching, this level of independence would be wasted because the signals within a given bus are not switched independently and thus would not require independent Mux select signals. Grouping control signals permits the second level control-path routing structure 52 to have a partially-populated switch matrix (not illustrated) fused such that it forms a 4:1 Mux for each of 32 output signals. It will be appreciated that the number of output signals is arbitrary and results from a trade-off between fuse count and flexibility. These same design considerations control whether the second level control-path routing structure 52 has a fully or partially-populated switch matrix.

Figure 6:
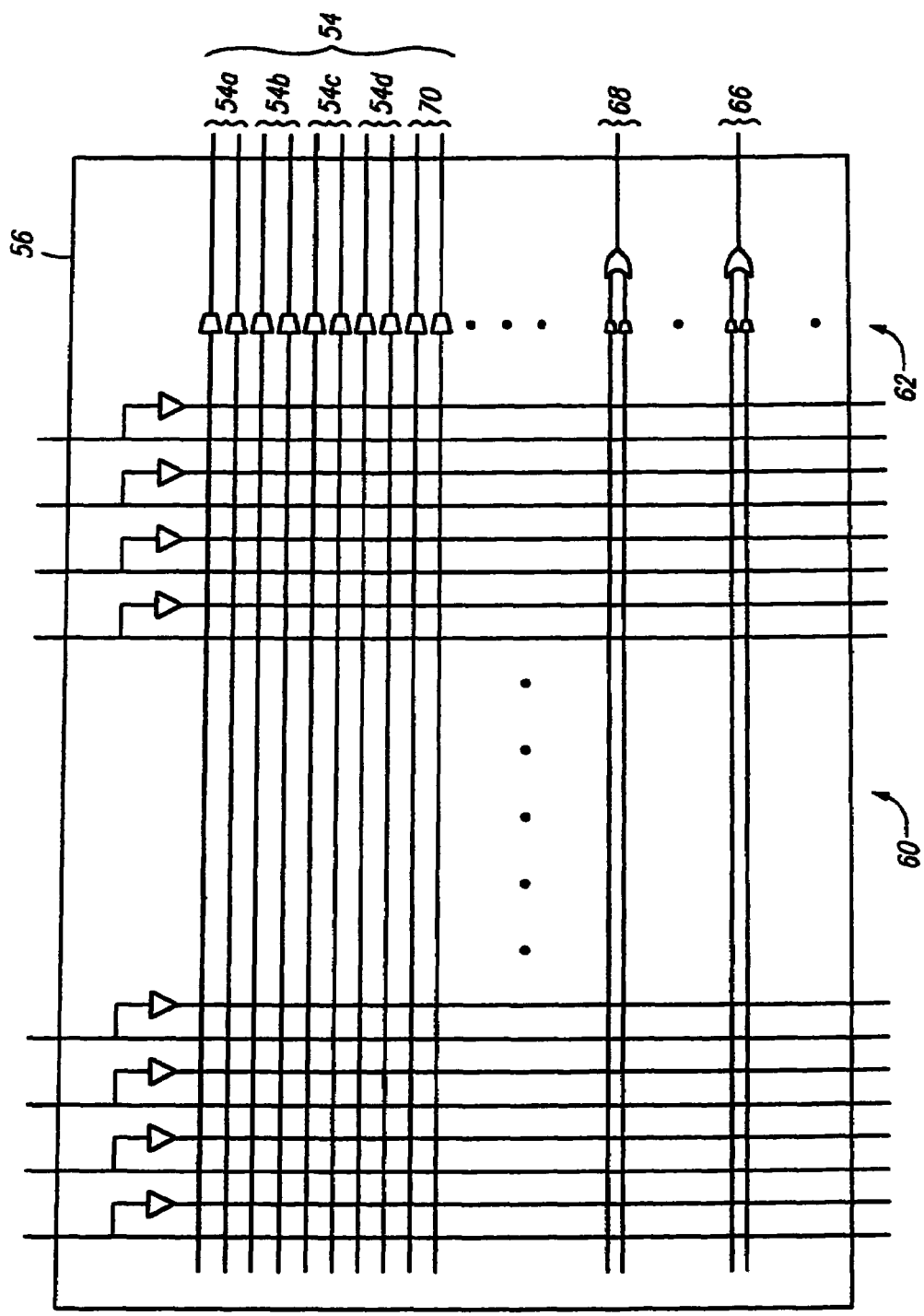
FIG. 6 illustrates a control array for generating product-term control signals according to one embodiment of the invention.

To generate independent control functions for the control signals developed by the control-path routing structure 36, the control array 56 within I/O block 32 (FIG. 3) has an AND array 60 to form product-terms 62 as illustrated in FIG. 6. The control array receives both the true and complement of the outputs from the second level control-path routing structure 52 (illustrated in FIG. 5). For an embodiment having 32 output signals from the second-level control-path routing structure 52, AND array 60 thus receives 64 signals. The number of product terms 62 derived from the AND array 60 depends upon the balance desired between fuse count and flexibility, just as discussed with respect to the second level control-path routing structure 52. In other words, increasing the number of product term outputs from the AND array 60 will increase the flexibility in the control options available to the user. However, increasing the number of product term outputs will increase the required number of fuses, increasing costs. As shown in FIG. 3, desired control signals include the Mux selects 54 for the 4:1 multiplexers 12, output enable signals (OE) 66, set/resets 68, clock and clock enable (CE) signals 70. In the embodiment illustrated in FIG. 6, AND array 60 produces 20 control signals:8 product-term Mux selects 54, four product-term clock/clock enable signals 70, four product-term set/resets 68, and four product-term OE signals 66. It will be appreciated that the actual number of each type of product-term control signal produced by the AND array 60 is arbitrary and is driven by a tradeoff between fuse count and control function flexibility. Further details of the control functions provided by the AND array 60 are described in co-pending U.S. application "I/O Block for a Programmable Interconnect Circuit," concurrently filed herewith. Because each 4:1 Mux 12 (FIG. 3) in an I/O cell 31 requires two Mux select signals, a fully independent control of all 16 multiplexers 12 within I/O block 32 of FIG. 3 requires 32 Mux select signals. However, as discussed with respect to the second level control-path routing structure 52 of FIG. 5, control signals may be shared between I/O cells 31 within an I/O block 32 if a bus-switching application is assumed. Thus, for the embodiment illustrated in FIG. 6, the product-term Mux select signals 54 are arranged in sets 54a through 54d of two product-term signals each, thereby resulting in sharing of control signals. For example, product-terms 54a could control four of the 4:1 multiplexers 12 within an I/O block 32 (FIG. 3), set 54b would control another four, and so on. In such an arrangement, the four multiplexers 12 having common Mux select signals 54 cannot be switched independently. Referring back to FIG. 3, each 4:1 Mux 12 for each cell 31 within I/O block 32 receives 4 data signals on data signal paths that are independent from Mux 12 to Mux 12 within I/O block 32. However, each 4:1 Mux 12 within a cell 31 may not have such independence for its control signals (Mux select signals 54). Instead, each 4:1 Mux 12 for each cell 31 within I/O block 32 receives 2 Mux select signals 54 on control signal paths that may be shared among a plurality of multiplexers 12 within I/O block 32. For the embodiment discussed with respect to FIG. 6, this plurality of multiplexers 12 sharing Mux select signals 54 is four.

Figure 7:
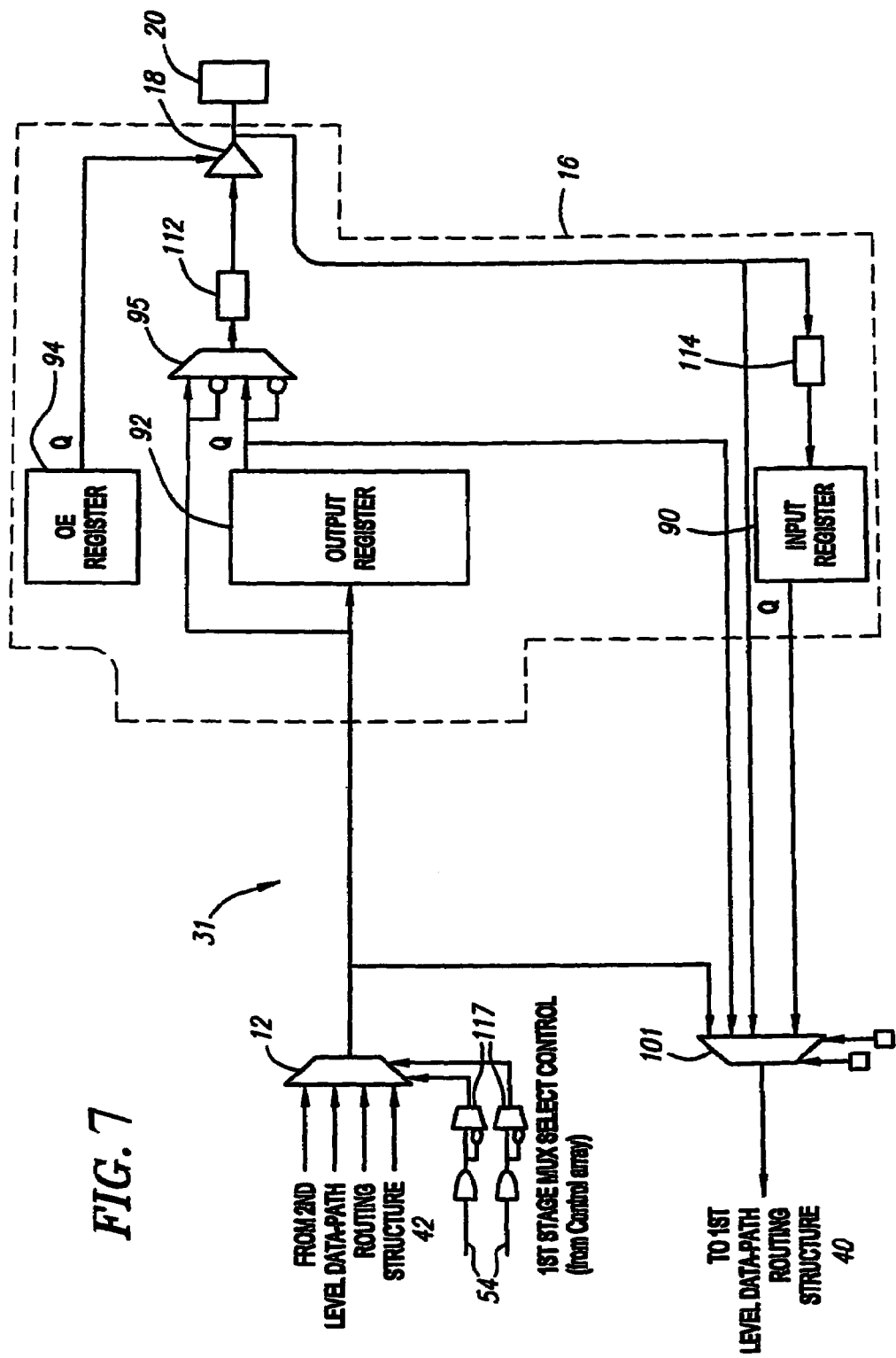
FIG. 7 is a block diagram for an I/O cell according to one embodiment of the invention.

Turning now to FIG. 7, an embodiment for the I/O circuit 16 of FIG. 3 has its input register 90 and output register 92 separated, providing true bi-directional input and output capabilities. Although such bi-directional capability is advantageous, the block-oriented architecture 30 of the present invention may be implemented without separate input and output registers in I/O circuit 16. The output register 92 receives the output of 4:1 MUX 12 and provides a registered output signal Q to an output buffer 18, which in turn provides an output signal to its pin 20. An OE register 94 controls the output buffer 18. Input register 90 may receive an input signal from pin 20. A feedback or input MUX 101 for the I/O cell 31 selects outputs from the 4:1 MUX 12, the output register 92, and the input register 90, providing a fast feedback path to its I/O block's routing structure 15.

Because each 4:1 MUX 12 may have this fast feedback path, wider MUXes such as 16:1, 64:1 or even wider may be formed through MUX cascading with additional incremental routing structure delays. For example, a 16:1 MUX (not illustrated) can be configured from the outputs of 5 4:1 MUXes 12, resulting in one additional level of routing structure delay. Similarly, a 64:1 MUX (not illustrated) can be configured out of 21 4:1 MUXes 12, resulting in two additional levels of routing structure delay. The width of the resulting multiplexer is limited only by the supply of 4:1 MUXes 12 and the levels of delay that can be tolerated. In addition to forming wider multiplexers, the fast feedback path may be used to form larger look-up tables (LUTs). Each 4:1 MUX 12 may be configured as a 2-input LUT using its four data inputs and two product-term MUX select signals 86. The four data inputs would have to be known values so that the appropriate input may be "looked-up" according to the state of the two product-term multiplexer select signals 54. Using the fast feedback path, four 2-input LUTs (4:1 multiplexers 12) may be combined to form a four-input LUT (not illustrated), resulting in one additional level of routing structure delay.

An output register bypass MUX 95 selects between either the registered output Q of output register 92 or the unregistered output of 4:1 MUX 12. In this fashion, output buffer 18 may receive either a registered or unregistered output signal. In addition, the output register bypass MUX 95 provides polarity control for either output signal. To prevent ground bounce, output register bypass MUX 95 couples to output buffer 18 through a programmable delay element 112. Similarly, another programmable delay element 114 adjusts the hold time of the input register 90. Each register 90, 92, and 94 and the 4:1 MUX 12 within the I/O circuit 16 receives product-term control signals from the control array 56 (FIG. 6). The product-term MUX select signals 54 couple through polarity selection MUxes 117 to the 4:1 MUX 12. The coupling of the remaining product-term register control signals will now be described with respect to FIGS. 8a and 8b.

Figure 8A:
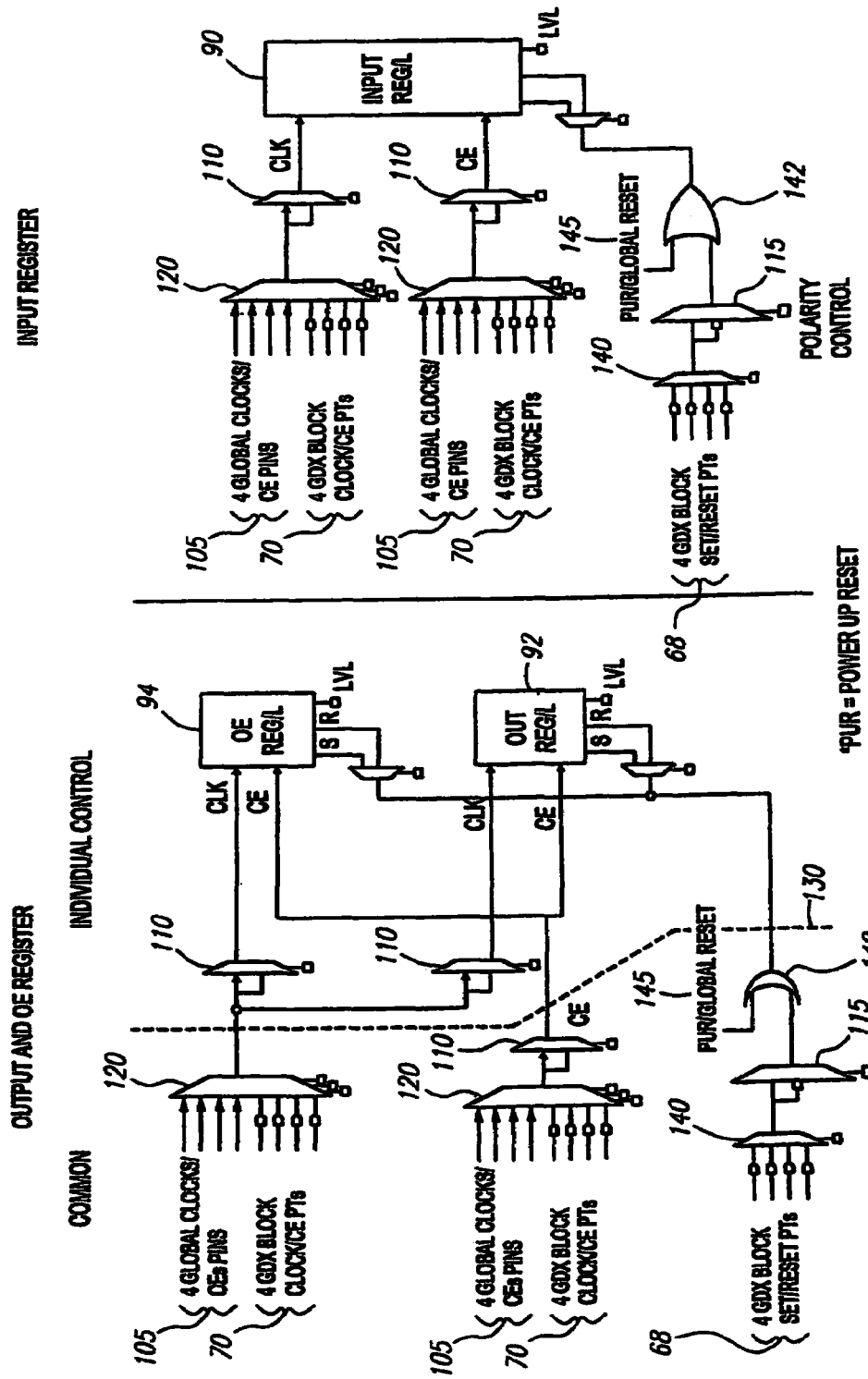
FIG. 8a illustrates the coupling of product-term control signals to the I/O cell of FIG. 7 according to one embodiment of the invention.

Turning now to FIG. 8a, the coupling of the product-term control signals from the control array 56 to the I/O cell's registers is illustrated. In addition to the product-term clock and clock enable (CE) signals 70, global clock signals 105 are also distributed to the registers. To control clock skew and permit clock synthesis, each global clock signal 105 is associated with a phase-locked loop (PLL) 100 (FIG. 2). Thus, should there be four global clock signals 105, there will be four PLLs 100. Further details regarding PLLs 100 are described in co-pending U.S. application Ser. No. 10/021,873, now U.S. Pat. No. 6,661,254, "Programmable Interconnect Circuit with a Phase-Locked Loop,", concurrent filed herewith, the contents of which are hereby incorporated by reference. Global clock signals 106 couple to programmable interconnect device 25 through dedicated pins (not illustrated). From these dedicated pins, global clock signals 105 are distributed to the I/O circuits 16 through a clock tree (not illustrated) independently of the routing structure 14. The clock and CE input to each register 90, 92, and 94 in I/O circuit 16 couples through a clock MUX 120 that selects between the global clock signals 105 and the product-term clock and clock enable (CE) signals 70. MUXes 110 provide polarity control for the output signal of clock MUXes 120. A clock MUX 120 may be common to both clock inputs of the OE register 94 and output register 92. Similarly, a clock MUX 120 may be common to both CE inputs of the OE register 94 and output register 92. However, as the dashed line 130 indicates, the polarity MUXes 110 provide individual control for these inputs despite their common origin at the clock MUXes 120.

The set and reset input signals for the registers 90, 92, and 94 are selected from the product-term set/reset signals 68 at MUXes 140. Polarity MUXes 115 provide polarity control to the MUX 140 output signal in a similar fashion as with the clock inputs. To permit a power-up reset (PUR) or global reset control function, a PUR/global reset signal 145 is ORed with the outputs of the polarity control MUXes 115 at OR gates 142.

Figure 8B:
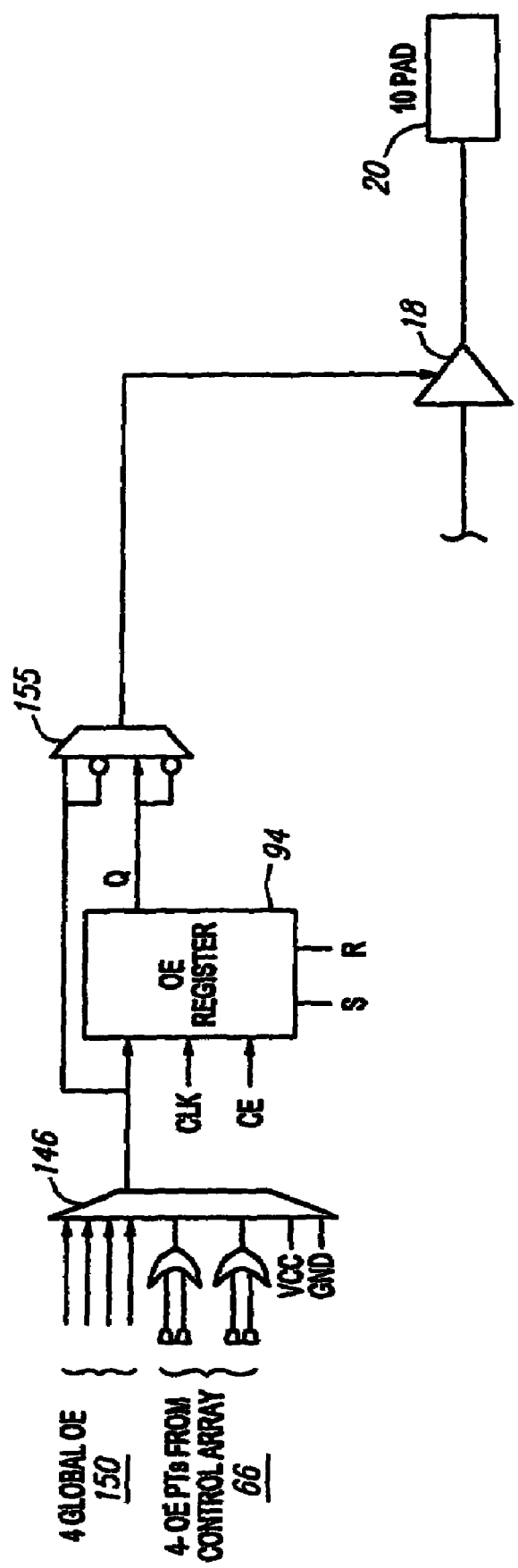
FIG. 8b illustrates further coupling of product-term control signals to the I/O cell of FIG. 7 according to one embodiment of the invention.

Turning now to FIG. 8b, the coupling of the product-term OE signals 66 from the control array 56 to the OE register 94 is illustrated. The data input to the output register 94 receives the output of a MUX 146 that selects between the product-term OE signals 66 and four global OE signals 150. These global OE signals 150 route from dedicated OE pins independently from routing structure 14 analogously to the global clock signals 105. In addition, MUX 146 may select either VCC or ground (GND) and provide the selected signal as the data input to OE register 94. Output enable register 94 controls output buffer 18. This control may be either registered or unregistered by the output enable register 94 because of an output enable register bypass MUX 155. If an unregistered control is desired, register bypass MUX 155 selects the output of MUX 146.

Alternatively, the registered output Q of OE register 94 may be selected by register bypass MUX 155 for coupling to the output buffer 18.

The fusing of the routing structures 15 to form the programmable interconnect as well as the configuration of the remaining devices may occur through signals stored in non-volatile memory. This non-volatile memory may be in-system programmable. In-system programmable circuits are discussed, for example, in U.S. Pat. No. 5,237,218 to G. Josephson et al., filed on May 3, 1991 and issued on Aug. 17, 1993. The disclosure of U.S. Pat. No. 5,237,218 is hereby incorporated by its entirety to provide background information regarding in-system programmable circuits. In addition to in-system programmability, the programmable interconnect device disclosed herein may also have boundary scan test capability compliant with IEEE Std. 1149.1 (the "JTAG standard"). The JTAG standard, which is set forth in *IEEE Standard Test Access Port and Boundary—Scan Architecture*, published by the Institute of Electrical and Electronics Engineers, Inc. (May 1990) is well-known to those in the art.

Although the invention has been described with reference to particular embodiments, the description is only an example of the invention's application and should not be taken as a limitation. Consequently, various adaptations and combinations of features of the embodiments disclosed are within the scope of the invention as encompassed by the following claims.

We claim:

1. A programmable interconnect circuit, comprising
   a plurality of input/output (I/O) cells arranged into a plurality of N I/O blocks, wherein each I/O block includes at least two I/O cells and each I/O cell includes a multiplexer and a register associated with a pin of the programmable interconnect circuit;
   a plurality of N routing structures corresponding to the plurality of N I/O blocks, each routing structure configured to receive signals from the plurality of I/O cells and programmable route the signals to each I/O cell within the routing structure's I/O block, wherein the register of each I/O cell comprises an output enable register coupled to the I/O block's routing structure, the output enable register controlling an output buffer coupling an output from the I/O cell's output register to its pin.

2. The programmable interconnect circuit of claim 1, wherein the register of each I/O cell within a I/O block further comprises an input register coupled to the I/O block's routing structure and to the I/O cell's pin and further comprises an output register coupled to the I/O block's routing structure and to the I/O cell's pin, and wherein each multiplexer within each I/O cell is configured to select among a plurality of M signals programmably routed through the multiplexer's I/O cell's I/O block's routing structure to produce a multiplexer output signal, and wherein each I/O cell's output register is coupled to receive its I/O cell's multiplexer output signal.

3. The programmable interconnect circuit of claim 2, wherein each I/O cell's multiplexer within a I/O block is a 4:1 multiplexer such that the plurality of M signals selected among by each 4:1 multiplexer comprises four signals.

4. The programmable interconnect circuit of claim 1, wherein the routing structures are configured to programmable route signals according to configuration data stored in a non-volatile memory.

5. The programmable interconnect circuit of claim 4, wherein the non-volatile memory is in-system programmable.

6. The programmable interconnect circuit of claim 3, wherein the plurality of I/O cells are arranged in quadrants, the four signals being selected among by each 4:1 multiplexer each originating from an I/O cell within any quadrant.

7. The programmable interconnect circuit of claim 6, wherein each I/O block includes 16 I/O cells, whereby the programmable interconnect circuit may be used for bus-switching applications.

8. A programmable interconnect circuit, comprising:
   a plurality of input/output (I/O) blocks, each block including at least two I/O cells, each I/O cell including a multiplexer coupled to an I/O circuit, the multiplexers sharing a common set of control signal paths coupled to their select terminals but having different sets of data signal paths coupled to their input terminals; and
   a plurality of routing structures corresponding to the plurality of I/O blocks, each routing structure for receiving input signals and routing them to the corresponding I/O block, each routing structure being programmable to provide control signals for the common set of control signal paths and data signals for the different sets of data signal paths.

9. The programmable interconnect circuit of claim 8, wherein the number of I/O cells per block is at least four.

10. The programmable interconnect circuit of claim 8, wherein the number of I/O cells per block is at least sixteen.

11. The programmable interconnect circuit of claim 8, wherein the number of I/O cells per block is at least four.

12. The programmable interconnect circuit of claim 8, wherein each routing structure comprises a programmable switch matrix.

13. The programmable interconnect circuit of claim 8, wherein each routing structure is programmable to route an input signal received from an I/O cell onto any of the data signal paths coupled to the input terminals of a multiplexer.

14. The programmable interconnect circuit of claim 8 including a control array within each I/O block, each routing structure coupled through the control array to the common set of control signal paths for the multiplexers and to the I/O circuits.

15. The programmable interconnect circuit of claim 8, wherein each routing structure is programmable to provide multiple parallel data buses to the its corresponding I/O block, each data bus comprising a data signal path from each set of data signal paths for the multiplexers, each data bus selectable through the common set of control signal paths for the multiplexers.

16. The programmable interconnect circuit of claim 8, wherein each routing structure includes non-volatile memory for storing configuration data for programming the routing structure, the memory being in-system programmable.

17. The programmable interconnect circuit of claim 8, wherein each multiplexer has four input terminals and two select terminals.

18. The programmable interconnect circuit of claim 8, wherein an I/O circuit within an I/O block includes an input register and an output register, each coupled to the corresponding routing structure and to an I/O pin.

19. The programmable interconnect circuit of claim 18, wherein the I/O circuit further includes an output enable register coupled to the corresponding routing structure and to an output buffer, the output buffer couple to the I/O pin.

20. A programmable interconnect circuit, comprising
   a plurality of input/output (I/O) blocks, each block including a control array and at least two I/O cells, each I/O cell including a multiplexer coupled to an I/O circuit, the multiplexers sharing a common set of control signal paths coupled to the control array and to their select terminals but having different sets of data signal paths coupled to their input terminals; and
   a plurality of routing structures for receiving input signals and routing them to I/O blocks, each routing structure being coupled to a corresponding I/O block and programmable to provide control signals to the control array for controlling the multiplexers and to provide data signals for the different sets of data signal paths.

21. A programmable interconnect circuit, comprising:
   a plurality of input/output (I/O) blocks, each block including at least two I/O cells, each I/O cell including a multiplexer whose output terminal is coupled to an I/O circuit, each I/O circuit including input, output, and output enable registers and an I/O pin, the multiplexers sharing a common set of control signal paths coupled to their select terminals but having different sets of data signal paths coupled to their input terminals; and
   a plurality of routing structures corresponding to the plurality of I/O blocks, each routing structure for receiving input signals and routing them to the corresponding I/O block.

22. The programmable interconnect circuit of claim 21 wherein each routing structure is programmable to provide control signals for the common set of control signal paths and data signals for the different sets of data signal paths.

23. The programmable interconnect circuit of claim 22 including a control array within each I/O block, the corresponding routing structure coupled through the control array to the common set of control signal paths for the multiplexers and to the I/O circuits.

* * * * *

UNITED STATES PATENT AND TRADEMARK OFFICE
CERTIFICATE OF CORRECTION

PATENT NO. : 7,154,298 B1  Page 1 of 1
APPLICATION NO. : 10/022464
DATED : December 26, 2006
INVENTOR(S) : Om P. Agrawal and Jinghui Zhu It is certified that error appears in the above-identified patent and that said Letters Patent is hereby corrected as shown below:

Col. 10, line 18 - Delete "its".

Signed and Sealed this

Twenty-fifth Day of December, 2007

JON W. DUDAS
*Director of the United States Patent and Trademark Office*